United States Patent [19]

Fisch et al.

[11] Patent Number: 5,372,987
[45] Date of Patent: Dec. 13, 1994

[54] THERMAL RECEPTOR SHEET AND PROCESS OF USE

[75] Inventors: Richard S. Fisch, St. Paul; Hamid Barjesteh, Woodbury; Jeffrey C. Chang, North Oaks, all of Minn.

[73] Assignee: Minnesota Mining and Manufacturing Company, St. Paul, Minn.

[21] Appl. No.: 946,871

[22] Filed: Sep. 17, 1992

[51] Int. Cl.$^5$ .............. B41M 5/035; B41M 5/38
[52] U.S. Cl. .................... 503/227; 428/195; 428/212; 428/323; 428/325; 428/327; 428/423.1; 428/474.4; 428/480; 428/500; 428/913; 428/914
[58] Field of Search .............. 8/471; 428/195, 207, 428/913, 914, 323, 212, 325, 327, 423.1, 474.4, 480, 500; 503/227

[56] References Cited

U.S. PATENT DOCUMENTS

| | | | |
|---|---|---|---|
| 4,837,200 | 6/1989 | Kondo et al. | 503/227 |
| 4,923,848 | 5/1990 | Akada et al. | 503/227 |
| 4,999,076 | 3/1991 | Incremona et al. | 156/241 |

OTHER PUBLICATIONS

"A High Speed Dye Transfer Printing Process Applicable to Rough Paper" by N. Tagucky, A. Imai and Y. Fukui of Matsushita Electrical. May 1991, pp. 308–311.

*Primary Examiner*—B. Hamilton Hess
*Attorney, Agent, or Firm*—Gary L. Griswold; Walter N. Kirn; Mark A. Litman

[57] ABSTRACT

A process for forming a color proofing image by thermal transfer systems and an improved thermal transfer receptor sheet are described. The receptor sheet has a hot melt adhesive layer with one quarter percent or less of particles therein. In the thermal transfer process, both the image and a thermal transfer receptor layer are transferred to a second receptor surface.

10 Claims, No Drawings

THERMAL RECEPTOR SHEET AND PROCESS OF USE

BACKGROUND OF THE INVENTION

1. Field of the Invention

The present invention relates to thermal transfer receptor sheets and to thermal transfer processes using receptor sheets of the invention. These processes and receptor sheets are particularly useful in enabling thermal transfer images to be applied to diverse geometric shapes and irregular surfaces.

2. Background of the Art

In a graphic arts design or an artistic environment, it is often necessary to create many preliminary, test, or proof images of a single subject before the final image is accepted. Such preliminary images may be produced by many different media techniques including, for example, color chalk on paper, oil on canvas, water color on paper, dyes in photographic film, and digital images in a computer memory. When many copies of such images are needed, they are usually reproduced as ink on paper by a printing press.

Traditionally in the printing process, the colors making up the design or image are separated using photomechanical (analog) means. This separation requires multiple exposures of the original image through select color filters to obtain so called color separations which can be transferred onto printing plates. Those individual color plates are then used sequentially to print respective colors as ink on paper.

The means most often used to produce full color ink on paper images is a reproduction chain that increasingly allows artists, designers or advertising agencies to expand their creativity. Images are often sought which contain custom colors (as in corporate logo colors) or special color combinations to attract attention. Metallic effects such as silver, gold or copper are also being used more frequently. A system of visualizing how such designs might look as ink on paper is often employed. Such systems are called "proofs" or "proves".

Traditionally, two different technologies are used to produce commercial grade, single sheet (analog) prepress proofs from existing hard copy half-tone separation films. One system is based on powder deposition wherein a colored powder (toner) is directed to adhere to a tacky image, and the other system is based on the change in solubility of a layer of colored photomechanical imaging materials after being imagewise exposed to light. With single sheet proofs, the color information in each of four color separations is produced and overlaid in register to produce a full color reproduction.

Increasing emphasis is being placed on electronic imaging where an image (digital) is constructed by means of computers, graphic design, or publishing programs and a TV like color monitor. Because these images only exist as (digital) electronic files, special equipment is used to make a hard copy for file purposes or approval by an authority higher than the image designer.

Several types of color printer devices may be used to output digital images. Copier (printer) devices at present do not deliver color representations sufficiently indicative of the final image as reproduced with ink on paper to be useful as a proofing image.

To achieve acceptance of the interim or final image produced from such digital files, a proofing or "Proving" device is desirable over a computer (copier) printer. In the case of electronic color images that are destined to convey a concept or predict the final printing of a color image, the difficulty in predicting the final image is complicated by the fact that the image produced by these output devices are not physically and integrally on the same substrate that will be used for the final image.

Commercially, images can be printed on various stocks and surfaces from very thin paper made for publication printing exemplified by what is referred to in the industry as "Brownwood" paper, to highly glossed thick paper for magazine covers or commercial high grade laminated papers called "Chromcoat".

Furthermore, in some design instances it is necessary to visualize the appearance of an image as it would appear when used on round containers such as beer cans, a final box package such as those in which cereal or toothpaste is sold, or a closure such as the toothpaste tube itself. For example, in the packaging industry, innovative container designs are used to effect point of sales purchases. In the packaging industry it is often a requirement that candidate packaging be examined in its three-dimensional form before being approved by the advertising or concept group in charge of merchandising.

The individual proofing color images made by analog means can be transferred to other substrates using the information disclosed in (U.S. patent application Ser. No. 07/728,311). The transfer of such images is facilitated by the fact that each color image exists separately on a layer of polymeric material and the integral color images making up the design as a whole is assembled into a sandwich. Such a sandwich can be used in a cut and paste mode to simulate a box or other diverse shape package. Such hand craft manipulations are time consuming and cost ineffective. The final output of such efforts are at best meager substitutes for the real package.

Images created in an electronic file of a computer and generated on a copier or prover such as those using dye (unit transfer) or mass transfer systems or wax crayon type materials to produce color areas are overprinted on each other without the need for separate integral supports. However, these images also require hand manipulation to form a box, bottle shape, or complex three dimensional design.

In an electronic printer or proofer, the image is in the form of a numerical file. Image data can be transferred to a transducer to enable conversion of that image into a thermal pattern through the use of a wire embedded head or a liquid crystal display which serves as a mask, or by other devices that change one form of informational energy to another.

In systems using thermal transfer, a transducer allows the electronic file to be generated by heat in an imagewise manner. A donor sheet of a fully coated tape or sheet panel of a color on a substrate in contact with a imagewise heated transducer and colorant receptor sheet allows color to be transferred imagewise from the donor sheet to a receptor sheet. These devices theoretically could be constructed so that color can be transferred imagewise to the various can diameters, box dimensions and tubes of various shapes. Such a machine, with the versatility desired to allow for full creative expression, while theoretically possible to construct, is uneconomical to make and use in the work areas normally used by artists and designers. These areas include art studios, offices, and image maker environments of restricted size, shape, and design.

Former techniques for providing transfer images by means of traditional graphic arts mechanical means include techniques wherein an adhesive is applied onto the entire surface of the support sheet and graphic design, relying on various mechanisms for adhesive cleavage of the image area. Specifically U.S. Pat. No. 3,987,225 (Reed et al.) and B.R. 959,670 (Mackenzie) disclose articles wherein adhesive sheer is induced at the edges of the design or incorporated to assist indifferential transfer, by incorporation of a solvent or dispersing powder in the adhesive. Others have used the concept of migrating components to advantage. U.S. Pat. No. 4,177,309, (Shadobolt) uses a polar wax to lower the tack adhesive in contact with image areas while simultaneously unaffecting adhesive in contact with image areas. Tordjiman (U.S. Pat. No. 3,741,787) discloses solvent migration as a means of disrupting the bond between the graphic design and the carrier. Bennett et al. (U.S. Pat. No. 4,454,179) discloses the preparation of a dry transfer technique wherein differential tack and transfer characteristics are achieved by photomechanical means. Specifically, graphics are printed onto the surface of a low energy carrier such as polypropylene and subjected to drying and corona treatment. Both graphics and carrier are overcoated with an actinic radiation responsive adhesive. To facilitate differential tackification the adhesive is exposed, using graphics as an exposure mask. The end result is a diminution or detackification of the exposed adhesive. The article is then burnished to a support and the image transferred to said support. U.S. Pat. No. 3,013,917 (Karian et al.) and U.S. Pat. No. 4,111,734 (Rosenfeld) disclose dry transfer articles employing non-differentially tackified adhesives. The articles disclosed are made by printing ink on to a low energy support to form a desired graphic pattern and overcoating the bottom side of the graphic pattern and exposed portions of the carrier with an adhesive. Application to a new substrate is provided by contacting the article to the substrate and applying pressure. U.S. Pat. No. 4,999,076 (Incromona et al.) describe a transfer system whereby 1) a release liner is coated with at least one layer of adhesive, 2) application in imagewise fashion of at least one layer of an imaging material to the exposed substrate and forming a graphic pattern from the imaging material and adhesive, and forming a graphic pattern from the imaging material and adhesive, 3) contacting the graphic pattern and exposed surface of the adhesive with a carrier film having high compatibility with the adhesive and low compatibility with the graphic pattern and 4) applying sufficient pressure, and if necessary heat, to the carrier film to adhere the adhesive there to. This disclosure makes a special point of stressing that the imaging material be applied to the adhesive and that the graphic pattern be subsequently formed thereof (by drying, curing, fusing, etc.). Prime coats for the described construction include Boehmite, modified silica, etc.

The use of dye sublimation as a transfer medium is not new, having been described in U.S. Pat. No. 4,088,442, U.S. Pat. No. 4,076,495, and U.S. Pat. No. 4,008,998 which describe dye image transfer by dye sublimation from intermediate 3–4 color sublimable images printed onto a carrier sheet. Transfer of images produced by the exposure of sequentially coated panels of sublimable color panels and their retransfer onto diverse final supports are described in "Color in Color" by Dybvig, Revensen, Ulseth, and Wiese in "Color Theory and Imaging Systems" edited by R. Enyard, Published by the Society of Photographic Scientists and Engineers, 1962 pages 403–411. Image transfer from an intermediate sheet to a final substrate after initial image-wise sublimation is also described in this paper. Heat retransfer of sublimable color images made by analog dye transfer means is also described in U.S. Pat. No. 4,006,018. Additional art illustrating the use of volatile dyes of the type used in dye transfer printing can be found in U.S. Pat. No. 3,767,394 wherein an analog process is employed to transfer coated sublimable dyes by infra-red absorbing images. U.S. Pat. No. 4,251,611 teaches the transfer of a dye sublimation image formed by digital laser exposure of a photoconductor and dye attraction by electrostatic means to said photoconductor. The image is transferred to a support and then retransferred to a final support.

In areas of prepress proofing transfer systems including those wherein a photosensitive layer is made to coat over a low adhesion material and, after being imaged and processed to disclose a visible image, the formed image areas are made to transfer to a substrate either as an individual colored image or as a packet of at least 4 different color images each formed by the process of exposure then development, then transferred individually until a full 3–4 color image is completed, such a transferred pattern consists only of images that are isolated from one another (individual halftone dot areas) without the benefit of interstitial binder or a joining adhesive layer. Other systems have image areas formed by exposure of a photosensitive color containing or color adjacent layer laminated onto a temporary receptor which is developed and then reapplied to a second support as a single sheet containing a packet of individual color images. In this type of system, a full image (that is an image consisting of a series of layers of different color dots) without interstitial binder is transferred in situ with an adhesive layer holding the halftone dots (Matchprint TM). Under certain circumstances the first transferred layer can again be transferred (2nd transfer) to a final support.

More recently, thermal-transfer type color provers or printers have been developed using either dye transfer or mass transfer (single or first transfer) from color containing donor sheets to a final support, such final supports being a specially prepared final sheeting. Although a more market acceptable rough paper is needed, transfer systems today have difficulty in making a first transfer to this type surface. References on these points include S. Masuda, N. Kihara, and O. Majima "Color Video Printer" IEEE Transaction on Consumer Electronics, CE-28 (3) pp. 226 (1982) and N. Taguchi, T. Shimixu, A. Imai, S. Hotta, S. Mina, and H. Irie "Dye Transfer Type Thermal Printing Sheets" Proceedings of the 14th Joint Conference on Image Technology.

Such transfers are from color donor sheet to a first transfer receptor (one-shot or final receptor). To facilitate such transfers (facilitation includes continuous tone not mass transfer of color images, uniform dye coverage of solid layers, reduced friction or smooth transport through the printing device during the transfer action), inventors have resorted to spherical or non-subliminal spacers in either the donor sheet and/or the 1st transfer (receptor) layers (U.S. Pat. No. 4,541,830, 4,772,582, and 4,876,235). Such spacers are placed in the top surface of said layer and protrude through that surface to provide an air interface between donor and receptor.

Also described are coated layers on top of a color donor sheet, such layers containing polysiloxane materials having terminal hydroxyl groups (E.P. 2011969, T. Kawakami, H. Matsuda, S. Tanimore and S. Sano). Other have used donor layers containing silicone or fluorinated moisture cured resins (E.P. 336394, A. Imai, et al.). Receptor sheets containing polyester resin and white micropowder (J.P. 63001595) have also been employed for this purpose. Other patents including U.S. Pat. No. 4,772,582, A. Imai, et al. and Hotta et al. U.S. Pat. No. 4,541,830 described receptor sheets containing uniformly distributed, non-subliminal particles to form surface irregularities to enable stable running, good color depth, and reduced color drop out and noise.

U. S. 4,923,848 assigned to Dai Nippon Printing, Co. claims a process for forming sublimation transfer images on an objective body. The process involves 1) making a 3-4 color sublimation transfer image on a receptor sheet, and 2) retransferring the formed sublimation transfer image to a final surface. This process seems to be capable of retransferring the sublimation transfer image only once, resulting in a mirror image of the original. This process is similar to those disclosed in U.S. Pat. No. 3,906,138 in which a transparent secondary print is formed by the re-transfer of a sublimation dye from a formed image onto a temporary primary sheet.

U.S. Pat. No. 4,923,848 describes the imagewise transfer of dye sublimed images from donor sheet (transfer 1) to a transfer sheet (transfer n). The transfer steps cannot proceed past n+2. The receptor sheet in U.S. Pat. No. 4,923,848 consists of a image receiving layer and a layer of hot melt adhesive adjacent to the support (referred to in this application as an "A" sheet). The imaged "A" sheet is mated coated layer to coated layer to a "B" sheet containing an adhesive layer and a film protective layer. In this invention the "A" sheet consists of a dye receptor layer, an optional barrier layer, and a hot melt adhesive layer to affect image-wise transfer of a dye (transfer 1) to a transfer sheet (n) and from that sheet to many sheets (n+ infinity). In all such transfer actions in this invention, the layer closest to the base of the transfer sheet ("A" sheet) is the top layer on the transferred image (a hot melt adhesive). In such systems the top layer provides the adhesive force to remove the image from its prior support. In U.S. Pat. No. 4,923,848 the unused "B" sheet is described as having a film protective layer closest to its support. Images transferred from an "A" sheet to a "B" sheet (transfer n) result in having a film protective layer on their upper surface. They therefore have no adhesive properties for further transfer (n+1). In this invention both used and unused "B" sheets have an upper layer of hot melt adhesive allowing infinite transfers. Transfer repetition is only limited by the flexability needed in the last transfer/ retransfer step.

Addenda have also been described for coated layers on top of a non-transferable color donor sheet, such layers containing polysiloxane materials having terminal hydroxyl groups (E.P.O. 2011969, T. Kawakami, H. Matsuda, S. Tanimore and S. Sano). Other have used donor layer containing silicone or fluorinated moisture cured resins (E.P.O. 336394, A. Imai, et al.). Receptor sheets containing polyester resin and white micropowder (J.P. 63001595) have also been employed for this purpose. Other patents including U.S. Pat. No. 4,772,582, A. Imai, et al. and Hotta et al. U.S. Pat. No. 4,541,830 described receptor sheets containing uniformly distributed, non-sublimable particles to form surface irregularities to enable stable running, good color depth, and reduced color drop out and noise.

Substrates using waxes have also been described (E.P.O. 319331, N. Taguchi, et al.), as have dye donor sheets with dispersions of colloidal silica in a polyester resin or silane copolymer (J.P. 1034784 [EPO 312637], A. Iami et al.). Dye Transfer materials (donor sheets) have been described using lubricant or heat releasing particles protruding above the level of the sublimed dye coating to improve running stability. Receptor layers (Single Transfer Receptors) have been disclosed containing matrices with silane couplers, and colloidal silica particles (E.P. 261970, H. Matsuda et al.) to improve dye transfer and smooth transfer during printing.

The objective of the present invention is to provide materials and processes that enable the transfer and retransfer of a thermal dye and/or mass images multiple times, allowing both the production of correct-reading images as well as mirror images on a variety of final supports.

Additionally, a color transfer printing machine has been described in "A High Speed Dye Transfer Printing Process Applicable To Rough Paper" by N. Taguchi, A. Imai, and Y. Fukui of Matsushita Electrical in Preprints of Technical Papers presented at the May 1991 meeting of the Society of Imaging Technology in Minnesota pgs. 308 to 311 which allows a double transfer system to improve image transferability. Such a device uses two heated sources. The first is a matrix of imbedded wires to transmit a digital signal to a donor sheet in contact with a first transfer sheet. The transfer is done individual color by color using a thermal print head, with an originating (first) dye transfer sheet transferring color onto an intermediate transfer sheet. The device then allows the individual first transferred color layer to be additionally transferred to a rough paper sheet by means of a nonimaging hot roller. It should be noted that this transfer is accomplished individual color by color until a single full color image (3 or 4 color image) is obtained. It is believed that the material in use in this device is described in J.P. 58220788, N. Taguchi, T. Shimizu, S. Hotta, W. Shimotsuma and S. Arai.

BRIEF DESCRIPTION OF THE INVENTION

This invention describes a process and materials to be used to thermally transfer color images from the output of an electronically addressed copier printer or proofer to additional supports of various size and shape. These supports may or may not have existing images on them.

The color thermal electronic copier, printer or proof systems routinely utilize two separate films. One film, the Donor film, contains a thermal sensitive layer which contains color mass or color dye transfer materials. When the donor sheet is addressed in an imagewise manner, the colorants are caused to change their chemical/physical form which allows them to be transferred to another film or support. The other film, a Receptor, consists of a paper or film substrate. The Receptor film is capable of receiving separate color dye (units) or color mass (areas) pixels from the donor film. This is accomplished by means of thermal contact of the wire containing head to the backside of the donor film. During this transfer operation, the donor film and receptor are in face to face contact under pressure. The thermal multiwire head (about 300 wires to the inch) is heated during the transfer operation in an imagewise pattern to effect color image transfer from an original donor sheet to a receptor.

For the purpose of this invention an image composed of at least 3 colors which is transferred en masse to a single receptor will be called Transfer 1. Subsequent transfers where the entire multicolored image effected by Transfer 1 (and any further additions thereto) will be referred to as Transfer n where n is the total number of en masse transfers. In the instant invention it may be greater than 2. In earlier practice it is believed to have been no more than 2.

In this invention, two separate thermal transfer receptors, "A" and "B" sheets, are involved. The "A" sheet is a light-insensitive (that is, the sheet is not imagewise sensitive to light by itself) receptor sheet used in the thermal transfer imaging process of the present invention. The receptor can be used either as a final image bearing substrate in an at least three color imaging process or can be used as a temporary or intermediate carrier sheet in a multiple step transfer process. The "A" receptor of the present invention comprises a multilayer sheet comprising at least three layers:

1) a flexible substrate,
2) a hot melt adhesive layer (transparent or opaque, depending on use), and
3) a dye receptor layer containing solid solvent(s) for the dye.

The receptor may also have other optional layers or features. There may be an optional surface modification on the flexible substrate to adjust the level of adhesion of the other layers to the substrate. This can facilitate transfer of the layers from the substrate or improve the adhesive of those layers to the substrate. The receptor layer and hot melt adhesive layers may also contain dyes or pigments, providing initial color areas or background and/or initial opaque areas or background. The "B" sheet is an intermediate image layer receptor, which is used together with the above "A" sheet in a multiple step transfer process. The "B" sheet receptor is used to receive a thermal image layer from the above "A" receptor and then retransfer the image layer to various substrates of interest under heat and pressure. It consists of a thin flexible substrate, a clear hot melt adhesive layer containing PMMA beads, and an optional microporous silicated top surface.

DETAILED DESCRIPTION OF THE INVENTION

The "A" receptor sheet of the present invention comprises at least three layers, the flexible substrate, a thermal adhesive layer, and a dye enhancement receptor layer all of which are insensitive to imaging radiation.

The receptor construction of this invention includes:
1. A flexible (transparent or opaque) substrate.
2. An optional surface modification on the substrate which may provide different adhesion from the original substrate to subsequent layers (e.g., a subbing layer to promote adhesion or a stripping layer to minimize adhesion), or treatments of the substrate by ionization e.g., corona discharge in air, vacuum, or gaseous atmosphere, coextruded substrates or additional surfaces with different coefficients of friction and or anti-stick coatings.
3. A hot melt thermal adhesive containing polymethylmethacrylate beads. Optionally opaque pigments and/or dye stabilization compounds may be incorporated into this layer to insure opacity and image or surface permanence.
4. A dye receptor layer containing solid solvent(s) for dye.
5. An optional stabilization compound to insure image or surface permanence.**
   **Optionally dye stabilization compounds may be incorporated into the hot melt adhesive layer.
6. An optional, but preferred, barrier layer between the hot melt thermal adhesive layer and the dye receiving layer.

The Substrate

The flexible substrate may be any flexible film forming material such as paper, polymeric film, and the like. The paper may have to have a release-type coating thereon to be useful in a multiple transfer step process. Release layers of silicone polymers, fluorinated polymers, polyesters, polyurethanes, and other polymers having appropriate surface energies are well known. Most polymers could be used as the flexible substrate, some with coatings to adjust their adherent properties with respect to the next down layers. Transparent substrates of polyester (e.g., polyethyleneterephthalate), polyolefins, polyvinyl resins (polyvinyl chloride, polyvinylidene chloride, etc.), polycarbonates, polyvinyl butyral, and polyamides, are preferred. The substrate for the "A" sheet normally requires a thickness of 50 to 250 micrometers in order to be able to feed through currently available printers, but with other systems, a range of 25 to 500 micrometers would be useful.

Hot Melt Adhesive Layer

Thermal adhesives are well known in the art. These are solid polymeric materials which soften at elevated temperatures to enable them to act as adhesives between materials. These adhesives may comprise any thermoplastic polymeric composition having appropriate thermal response properties and may be selected from many polymer classes including, but not limited to, polyamides, polyacrylates, polyolefins, polystyrenes, polyvinyl resins, and copolymers and blends of these and other polymers. U.S. Pat. No. Pat. No. 4,656,114 shows many useful thermal adhesives that would be appropriate in the practice of the present invention. The preferred thermal adhesives have melting temperatures between 50° C. and 110° C.

The adhesive layer contains beads which do not dissolve in the adhesive when it is coated out such as glass, ceramic, and polymeric beads such as polymethylmethacrylate beads, the beads being of a size from 8 microns at a level of at least 0,005% and no greater than 0.25% by weight of the adhesive. The beads are dispersed within the adhesive. The thickness of the adhesive layer should be between 2 and 10 micrometers. The bead concentration should be between 0.01 and 0.1 percent of the weight of total solids of the adhesive layer, preferably between 0.01 and 0.03. The number average size of the beads is usually greater than the thickness of the adhesive layer, but generally not more than three times the thickness of that adhesive layer, and preferably not thicker than the adhesive, barrier and enhancement layer thicknesses totalled (e.g., 3 to 30 micrometers). The beads of the adhesive layer b) may extend beyond layer b) and into the receptor layer c) and may even cause raised areas in the surface of the receptor layer c). However, the beads should not extend through the receptor layer c) and be actually exposed to the air. The material of the receptor layer c) should still cover the beads.

The adhesive layer may be clear or opaque, depending on applications. If the image layer is to be finally transferred to a transparent surface (e.g., a glass bottle), an opaque adhesive (or barrier layer) is preferred to hide materials behind that surface. Latex paints, for example, may be mixed with the latex adhesives to provide opaque layers.

Dye Reception Layer

The dye reception enhancement layer is coated as an individual layer which is in direct contact with the donor dye layer during thermal dye transfer imaging. The dye reception layer preferably has an optional barrier layer between it and the adhesive layer to prevent migration between the receptor layer and the adhesive layer. Materials resistant to solvent migration (hydrophilic polymers, for example) such as polyvinyl alcohol and polyvinylpyrollidone are particularly useful. The dye reception layer is designed to serve the following purposes:

1. To effectively receive a dye image from a dye donor ribbon without suffering from unwanted mass transfer of the donor dye coating.

2. To hold the dye image and yield a desired color print with high optical image density, brightness, and stability.

The dye reception layer consists mainly of a thermoplastic resin that has a strong affinity toward dyes. The resinous binder layer, when contacted intimately with a dye donor under heat and pressure, receives the dye that diffuses or sublimes from the donor. Several classes of thermoplastic resins are known in the literature for use as a dye receiver. Desired properties often mentioned are molecular weight, glass transition temperature, compatibility, etc., all which contribute to the dye receptivity of the receptor. The dye reception layer contains non-polymeric solvents for the dye, which remain solid at room temperature but liquify during imaging.

Problems with the conventional dye receptors include poor image density (especially for transparency receptor), low gloss, dye bleeding, and poor image light stability. These attributes may be modified by such dye solvents.

Note: Such printers as disclosed in the prior art are capable of both reflective and transparent images out put. Each of these require a different receptor. Images on transparent receptors, handled in the same manner as reflective images, usually exhibit poorer quality than the same image on a reflective receptor. The major image fault is that transparent images are deficient in final color density. It is believed that some of the additional color quality of the paper based receptor images comes from a cushioning effect of the pressure used in the process, the cushioning being provided by the paper support itself.

To improve the color quality of such transparent receptors, U.S. Pat. No. 4,6705,521 and U.S. Pat. No. 4,833,124 teach the practice of "double printing", that is the imaging of 2 yellow and 2 magenta and 2 cyan and 2 black images in superimposition on the transparent receptor to raise the density level. This technique is time consuming and costly. The transparent images produced by this technique need not be double printed to achieve good quality images.

Accordingly, in this invention it has been found that a bi- or multi-layer dye receptor construction consisting of a thermal adhesive underlayer and a dye reception layer provides enhanced dye receptivity and while substantially increasing image stability and glossiness.

To hold and maintain the dye image stability, the thermoplastic resins used in the dye receiving layer generally requires a higher glass transition temperature than the thermal adhesive. When this dye receiving layer is coated on top of the adhesive layer, the overall dye receptivity is enhanced significantly. The reason for this improvement is not clearly understood. We believe that an adhesive underlayer which has a lower glass transition temperature that allows better contact between the receiving layer and the dye donor and the thermal print head, thus resulting better heat transfer as well as better dye diffusion transfer. The adhesive underlayer appears to provide the receptor with additional insulation against heat loss through the substrate, thus also contributing to better heat utilization for the dye diffusion transfer. The presence of the PMMA beads also seems to lower the degree of mass transfer while allowing the dye to transfer.

The dye reception layer should be compatible as a coating with at least one of a number of resins to be used as an adhesive underlayer. Suitable resins for use as dye reception enhancement materials in this adhesive layer or as a separate overcoat layer include polyester, polyurethane, polyacrylate, polyamide, polyvinyl chloride, polyvinyl acetate, sulfonated polyester or polyurethane, copolymers thereof, and copolymers of vinyl chloride, vinyl acetate and/or vinyl alcohol. Ethylene vinyl acetate copolymers, vinyl chloride-acrylate polymers, and sulfonated epoxy hydroxy vinyl chloride copolymers be also particularly useful. Glass transition temperatures for these resins should be within the range of 50° C. to 150° C. Molecular weight of these materials is generally in the range of from 5,000 to 50,000.

Materials that have been found especially useful for forming the dye receiving layer include sulfonated hydroxy epoxy functional vinyl chloride copolymers as disclosed in U.S. Ser. No. 07/753, 862. They may be used alone or by blending with other polymers such those listed above. The limiting factors to the resin chosen for the blend vary only to the extent of compounding necessary to achieve the property desired. Preferred blendable additives include, but not limited to polyvinyl chloride, copolymers of vinyl chloride, vinyl alcohol and/or vinyl acetate, polyesters (especially bisphenol A fumaric acid polyester), acrylate and methacrylate polymers, and anti-mass transfer releasing agents. When an addition polymer, copolymer, or releasing agent is used, it is usually added in an amount of 80 percent by weight or less of the resinous composition of the dye reception enhancement layer, preferably in the amount of 10 to 75% by weight for non-release polymers, or 0.01 to 15% by weight for release polymers.

In a thermal dye diffusion transfer process, the dye receptivity of the receptor layer can be further increased by using a non-polymeric dye solvent. The solvent in the receptor, preferably more concentrated at the dye receiving surface, remains solid at room temperature, but becomes liquefied during thermal imaging. The liquefied solvent then assists in dissolving the dye in the donor sheet, which is in intimate contact with the receptor and, consequently, facilitates greatly the dye transfer from the donor sheet to the receptor sheet by capillary action as well as dispersion, surface tension, or diffusion. As a result, a significant improvement in image color density is obtained.

Many solid solvents when mixed with dyes form a mixture (perhaps a eutectic mixture) that has a melting point lower than either of its constituents, the dye, and the solid solvent. Usually the melting point should be above 20° C. and below 180° C., preferably between 20° C. and 110° C., more preferably between 22° C. and 100° C.

Moreover, the solid solvent also works as a thermal regulator during an imaging step. It is known that each of the line printing steps in commercially available thermal transfer printers consist of a heating and a cooling cycle. In the heating cycle (lasting for a few milliseconds), the solid solvent melts and extracts more heat from the print head, resulting in faster heat transfer from the thermal head to the dye receiving layer. In the cooling cycle, the melted solvent solidifies and gives off its latent heat, thus increasing the period of time the media is at a high temperature and consequently increasing the dye transfer. The gain in heat transfer rate by the use of a low melting solid solvent thus further increases dye image optical density.

Useful solid solvents are heat-fusible materials with a melting point above ambient temperature (i.e., 20° C.) and below 150° C. They must be compatible with dyes and, when melted, capable of dissolving the dyes. Dyestuffs used in thermal transfer imaging are generally aromatic compounds. Aromatic solid solvents for the dyes are preferred. Typical compounds useful in this case are diphenylamine (m.p. 53° C.), cinnamyl alcohol (m.p. 35° C.), 2-hydroxy-4-n-octyloxybenzophenone (m.p. 47° C.), 2-hydroxy-4-methoxy-benzophenone (m.p. 62° C.), ethyl-2-cyano-3,3-diphenyl acrylate (m.p. 96° C.), 1,1-diphenylethanol (m.p. 79° C.), triphenylmethane (m.p. 93° C.), 2,2-diphenyl-1,3-propanediol (m.p. 107° C.), and triphenylphosphate (m.p. 23° C.). The solid solvent is usually added in an amount of 1 to 60% by weight of the total composition of the dye receiving layer, preferably in the amount of 5 to 40% by weight. A material which is solid at room temperature, melts between 25 and 150° C., and can dissolve a dye used in thermal transfer from a donor sheet is a particularly useful solid solvent for dyes.

Release agents are generally characterized by low surface energy and include silicone and fluorinated polymers. Preferably, releasing agents are amino-modified silicone oil, and a special polymeric oil derivative with surfactant properties commercially available as Troysol™ CD1 from Troy Chemical Co., New Jersey. Silicone containing polymers and fluorinated group containing polymers may also be used.

The dye receiving layer may be prepared by introducing the various components into suitable solvents, then coating the resulting mixture onto the adhesive-coated substrate and drying the resulting coating, preferably at elevated temperatures. The layer may also be prepared from various water-based material such as in the forms of emulsions or dispersions. The thickness of the dye reception enhancement layer is from 0.001 mm to 0.1 mm, and preferably 0.003 mm to 0.010 mm.

The receptor layer thus formed is used to receive a dye image from a thermal dye donor. It can also receive a mass transfer image from special mass transfer donor sheets developed by 3M. The formed image on this receptor can be retransferred to many surfaces of interest, such as the intermediate "B" sheet or paper. The image is transferred as a whole imaged layer.

The intermediate image layer receptor ("B" sheet) is needed for multiple image retransfer. It is to be used as an intermediate receptor for receiving a dye image layer from the above dye and/or mass receptor and then retransferring to various substrates of interest under heat and pressure. It consists of a flexible thin substrate, a hot melt adhesive layer and particulates, especially poly (methyl methacrylate) beads. Image stabilizers such as UV absorbers can be added to either the hot melt adhesive layers or dye receiving layer.

As known in the art, conventional dye receptors normally have a releasing agent (usually low-energy silicone or fluorinated compounds) in the dye receiving layer to prevent any mass transfer from occurring during the thermal dye transfer imaging step. Because of the presence of low surface energy materials, subsequent bonding to this dye receiving surface by a retransferrable receptor is very difficult.

This design overcomes this problem by providing these layers with a microporous surface that facilitate color image layer reception, as well as an adhesion promoter. It has been demonstrated that a full color dye image is transferred from a dye sublimation printer adhered to the porous surface really well, facilitating subsequent retransfer process. The mechanism of the dye image layer adhesion to the porous receiver surface in this invention is different from those of purely thermoplastic type. The present invention relies on physical contact and entanglement.

The action of the microporous surface can be prepared by coating particulate matters as a slurry onto a primed polyester base. The technology for making such a surface for use as a primer for photographic coatings and pressure sensitive adhesives has been discussed in an European patent application EP 0301827 A2. Without a proper bonding between the original dye receptor and the dye image layer receptor, retransfer cannot proceed successfully.

Additionally, the use of a barrier layer to separate the adhesive from the dye recption layer in the "A" sheet is novel. Further, the transfer adhesive layers contain polymeric bead to facilitate transfer of the dye as well as mechanical motion of the transfer layer through the printer. The action of the particulates, and especially the PPMA beads is surprising. The prior art discloses many particulate materials incorporated into the donor or receiver layer coating. These are positioned in the outer most surface. The PPMA beads are on an inner most surface, incorporated into the hot melt adhesive. As such it is surprising that they influence product and printer performance.

It should be noted that the PPMA beads are placed into the coating closest to the substrate, and the final transfer sheet coating exhibits no sign of surface pattern because of the beads. Based on descriptions in the prior art cited above, one would imagine the need for a rougher surface at the donor and receptor (Transfer 1 or n) surface. This enhanced performance without surface roughness is therefore unexpected.

Also noted the concept of the Transfer "A" sheet that can be used alone for a final image or used to make a multi-transferred image in conjunction with the "B" sheet by transfers(n) made outside of machine is believed novel.

It is also believed that the use of PPMA beads in the lowest layer of the receptor sheets without a discernable surface change when all the prior art indicates a rougher surface is preferred is novel.

The barrier layer should reduce migration of materials between layers. The barrier layer is a layer whose major components' solubility characteristics are different than those of the receptor layer. The barrier component may be, for example, PVA, carboxyl methyl cellulose, or polyvinylmethylether. A screening test for barrier materials could be to coat a layer of thermal adhesive on a support, overcoat this layer with the candidate barrier layer, and mount this construction on a 45 degree angle wedge such that the sample forms a 45 degree angle to the horizontal plane. By an eyedropper, apply the solvent used in the dye receptor layer, allow the solvent to run off, wait 3 minutes, put the sample in a 350° F. oven for 4 minutes, remove and read the difference between the non-treated sample area and that area that the receptor solvent was applied to with a densitomer. If the difference between the two is greater than 0.05 optical density units, the barrier layer does not work.

If the now first transferred image on the A Sheet is to be further transferred for reasons of art and design or image and scene orientation, a like receptor sheet as described for the practice of this invention can be used (Transfer n). The color design image transfer (Transfer n) can be directly transferred to a special material, such as pulp type paper, newsprint paper, production type coated stock, separates or part of a package construction. The final image support may indeed be the box itself as a flat cut-out able to be folded into its container shape without image cracking or chipping, a diverse cylindrical object like a jar, beer bottle, or can, or some other shaped objects. The final image forms without calking as can occur in the assembling of a box.

Such ease of mounting effected by the process and transfer material allows true facsimile images of final product designs. It has been found that the color, and or gloss stock of a printed image has a much visual effect on the final image as any of the one or more colors making up the design. Such transfer techniques allow a preview not available on a color monitor screen or flat representation of the design. A color design on the specific paper, or of a desired gloss level as a flat image is preferred over that same image on a stock or gloss not representative of the final product. In point of fact, questions concerning product or packaging concepts are best viewed and handled on the final stock and in the shape or design for concept acceptance before resorting to the time and economic expense of printing ink on paper press images. The gloss of the final image may be adjusted by an embossing step or pressing step against a textured surface such as a roughened polyester film. The final imaged transferred layers of a "B" sheet consists of in the following order, a flexible substrate, a hot melt adhesive layer (with optional opaque materials), an optional barrier layer (with optional opaque materials), a color image layer and finally a second hot melt adhesive layer. This collection of layers on a "B" sheet can be transferred from substrate to substrate many times to form an integral image surface which is a composite or mosaic of many images. Such construction design is contrary to the teaching of U.S. Pat. No. 4,923,848 and thus provides a unique design capability.

Transfers 1–n can be accomplished whether the image exists in a whole or discrete manner (unit or mass transfer), whether the receptor is heated for transfer by a nonimage forming bar, roller or platen or other energy sources including but not limited to, laser, light emitting diode, printhead, pulsed ions, plasma, e-beam, and microwave energy before being transferred to the final image resting place. The final image substrate may be of the same composition as that used for Thermal 1 transfer or may be a different support of varied construction, diverse shape or complex surface. The receptor layer itself may be applied to the final image surface as well.

The receptor sheet may have a number of alternative structures and/or features beyond those already literally described. The support should be flexible (i.e., it should be able to be wrapped about an eighteen inch diameter pipe without cracking). The surface of the support may be subbed or unsubbed (e.g., a primer layer) or may be treated or untreated to alter its physical properties (e.g., corona discharge, plasma treatment, laser ablation, quasi-amorphized as by non-ablative laser treatment, etc.). The thermal adhesive and stripping layer may or may not contain pigments or dyes. The receptor layer may or may not contain additives which promote higher color densities at a given thermal imaging energy (e.g., a material with a high felicity for the dyes). In the optional barrier layer between the receptor layer and the thermal adhesive/stripping layer, there may also be pigments or dyes.

Alternate constructions which may be used in the practice of the present invention as temporary receptor sheets include, for example

| | |
|---|---|
| 1. Flexible Support | optional subbing or surface treatment |
| Thermal Adhesive and Stripping Layer | optional pigments or dyes in this layer |
| Receptor Layer | with compounds to allow higher color densities for a given thermal energy |
| 2. Flexible Support | optional subbing or surface treatment |
| Thermal Adhesive and Stripping Layer | optional pigments or dyes in this layer |
| Barrier Layer | optional pigments or dyes in this layer |
| Receptor Layer | with compounds to allow higher color densities for a given thermal energy |

The pigment is desirable in the barrier or thermal adhesive layer. If the final transfer is to be a transparent object then the transferred image cannot be seen easily. The transferred image needs a reflective coating to be easily seen by reflection. The pigment in these layers acts as a reflective surface. Many printed supports are of different colors because of design or economics. Some of these may not be immediately available for direct transfer or in a form to be used for transfer. The background color of a reflective sheet influences the color balance of images printed or transferred onto the sheet. While modifications in the image file can cause a uniform background color to the transfer image file, this technique consumes printing time. It is more economical to color the layers of the transfer sheets.

EXAMPLE 1

The donor sheet consists of sequential panels of color coated in roll form onto a transparent flexible support in the color sequence of Yellow, Magenta, Cyan and Black and available for purchase from Mitsubishi Electronics of Japan under the commercial designation MK2 Ribbon.

The donor roll is placed in the supply cartridge of the 3M Rainbow ™ Desktop Color Proofer.

The donor sheet is threaded into the printer in such a manner that the thermal head of the printer is positioned on the backside of the donor sheet.

The receptor sheet of this example are of the same basic construction:

Both have the same basic construction, however, one sheet identified contains polymethyl methacrylate beads with an average diameter of 7 to 8.5 microns and a size distribution of from 6 microns to 10 microns incorporated into the basic formulation.

1. A 5 mil transparent polyethylene terephthalate film.
2. A 10% polymeric solution of the transfer coating described below.

| Item #1 | ˣLatex #26314 | 9.0 lbs. by weight |
|---------|---------------|---------------------|
| Item #2 | ˣLatex #26106 | 2.2 lbs. by weight |
| Item #3 | Water (DI)    | 4.7 lbs. by weight |

Sufficient KOH to pH 5.6
Acrysol ASE-95 (10% Solution) 6.4 gms

The first sheet identified as "x" contains no polymethyl methacrylate beads. A second sheet identified as "y" contains poly (methylmethyacrylate) beads 0.2% by weight of the adhesive layers is coated by means of a #10 Meyer bar and dried at 220 degrees Fahrenheit for 2 minutes. ˣLATEX 26106 and 26314 are polymeric latex adhesive products of Goodyear. Acrysol is a product of Rohm and Hass.

A four color donor sheet roll is placed into the Donor Supply Cartridge and positioned in a commercially available 3M Rainbow ™ Desktop Color Proofer.

The above Receptor sheets are placed into the Receptor Supply Tray of said device and positioned in said device.

A four color design electronic image of a Porsche automobile is stored on a Magneto/Optical disk available from 3M and the electronic image is transferred using a Apple Macintosh Computer IIci to the 3M Rainbow ™ Printer. The data stream of the Porsche image is transferred (Yellow color file to Yellow color Panel first) from disk storage to the printer, and the printer head made to respond to this signal by selective heating of the wires in said head. Both layers are made to move under the heating element in synchronization with the transfer film. The heat transfers the image addressed portion of the Donor to the receptor. After the donor images are transferred in contact with the transfer film, the transfer film is returned to its starting position and the Donor sheet advances to another color panel (e.g., Magenta). The computer sends the electronic stored image file to the print head and again the donor layer is caused to transfer its color to the transfer film in register with the preceding image. When this action is completed, the donor ribbon winds to the next panel, the transfer film rewinds to the beginning, and an additional color is formed. This sequence repeats itself until all four of the color files associated with the color image is transferred to the receptor film from the individual color panels on the Donor (Transfer 1).

During successive lamination steps, the left to right image orientation of the electronic digital image may be changed so that a person viewing the final image may see that image as a mirror replica of the desired design. While the digital image can be transformed electronically to overcome this difficulty, this transformation can be quite long. It is included in this explanation to demonstrate a practice to overcome the mirror image effect. By means of this invention, the right to left image orientation after a transfer can be accomplished without computer intervention by allowing an additional optional transfer step (Transfer 2) to insure right reading images. The Transfer 2 step can be used for such an option but need not be employed. It is included in this explanation to demonstrate a practice to over come the mirror image effect.

When the initial image output from the 3M Thermal Color Printer is complete, the receptor transferred image on the receptor "A" sheet (transfer 1) is mated to another sample of the same "Y" Receptor layer and transfer of the image on the image on the first substrate to the second substrate "Y" substrate ("B" sheet) wherein Transfer n is effected.

The procedure to accomplish Transfer 2 was done when the image in the second substrate was mated to another Transfer 1 substrate (Transfer n+1) such that the color image on the second Transfer 1 is in intimate contact with the transfer layer of the second Receptor Layer. In contact, both films were passed through a laminating device available commercially as 3M Brand Matchprint ™ Laminator Model 4147. This device has both upper and lower upper heated rollers. The temperature of the upper roller was set at 180 degrees Fahrenheit (90° C.), and the lower roller at 280 degrees Fahrenheit (138° C.), ±20 degrees at a speed of 60 ft/min. After lamination the two sheets were separated and the four color image was seen fully adhered to the surface of the second receptor material (Transfer n+1) in a right reading form.

It should be noted that the image on the final receptor was of a high gloss nature and offered greater protection from abrasion than a similar image produced directly onto the coated side of a commercial receptor stock designated as Mitsubishi Type 1 Image Receptor commercially available for use in the aforementioned proofer.

If desired all of or part of the image on the final transfer surface can be modified from its glossy appearance by contact of the surface or the image to be mated to the surface of a material with a embossed surface and again passed as a sandwich through said Laminator.

Additionally, it should also be noted that a chatter and grinding noise emanated from the printer during Transfer 1 when sheet "x" was being printed. However, no noise or chatter was evidenced when sheet "y" was being printed. Sheet "y" also evidenced a higher color density than sheet "x".

Contrary to routine practice, which only allows the unit or mass color to travel to the receptor, the process of this invention allows both the color image and the transfer film to be transferred to the final paper support. This allows the final resultant image of this invention to exhibit less brittleness and greater dimensional stability.

Such transfer, that is transfer of both image and transfer layer, allows the image to be put on paper stock which may come with a rough surface structure that would normally absorb the image colorant and produce unsatisfactory results.

It also should be noted that printers normally use polypropylene supports for dye transfer purposes. Those substrates' handling and surface characteristics do not approach the visual or tactile sensations of an ink on paper commercial image.

Additionally such printers using image transfer means use a substrate thickness to ensure more reproducible color image transfer (heat distribution through the package of donor plus receptor is important to quality consistency) and the desired thickness of the final image bearing material destined for the desired proof image stock may be thicker or thinner than the thickness allowed by the printer device for quality output.

EXAMPLE 2

The Receptor Sheet of this example consists of;
1. A co-extruded 2 mil (0.051 mm) transparent polyethylene terephthalate film which has been constructed so that one side of the base has a more slippery surface than the other and known as 3M P56 base.
2. A 50% polymeric solution of latex Emulsion available commercially as Airflex TM 4530 from Air Products.
3. A 10% polymeric solution of the transfer coating disclosed in Example 1, item 2 is coated by means of a #12 Meyer bar and dried at a temperature of 240 degrees Fahrenheit for 3 minutes. Item 2 is coated on top of the above layer by means of a #10 Meyer bar and dried at 220 degrees Fahrenheit (100° C.) for 3 minutes.

This receptor sheet is loaded into the receptor tray of the printer described in Example 1. Following the procedure of Example 1 this receptor sheet is imaged and the image transferred to a second identical receptor.

The Receptor sheet thus formed (Transfer 1) was mated to the uncoated side of a opaque sheet of thermal transfer support commercially available from Mitsubishi known as Type 1 base, and passed through the 3M Matchprint TM Laminator (transfer n). This device has both upper and lower upper heated rollers. The temperature of the upper roller was set at 180 degrees Fahrenheit (82° C.), and the lower roller at 260 degrees Fahrenheit (127° C.), ±20 degrees at a speed of 60 ft/min. After lamination the two sheets were separated and the four color image was seen fully adhered to the surface of the second receptor material (Transfer n+1) in a right reading form.

It should be noted that the P56 support of Example 2 peeled off the final support more easily than that of the previous Example (1). It should also be noted that the final image (Transfer n+1) was of a high gloss nature and exhibited higher reflection optical density values than that of Example 1.

EXAMPLE 3

The Receptor Sheet of this example consists of;
1. A co-extruded 5 mil transparent polyethylene terephthalate film which has been constructed so that one side of the base has a more slippery surface than the other and known as 3M P56 base.
2. A 10% polymeric solution of the transfer coating disclosed in Example 1, item "2" is coated by means of a #12 Meyer bar and dried at a temperature of 220 degrees Fahrenheit (107° C.) for 2 minutes. Item 2 is coated by means of a #10 Meyer bar and dried at 220 degrees Fahrenheit (107° C.) for 2 minutes.
3. A 16.8% solid by weight in methyl ethyl ketone consisting of;
    7.34 gms MR-120, a multifunctional Poly Vinyl Chloride product of Nippon Zeon.
    7.34 gms VAGH/UCAR PVC/PVA, polyvinyl resin Copolymer, a product of Union Carbide.
    2.1 0 gms Troysol TM CD-1 dispersant from Troy Chemical in Methyl Ethyl Ketone.

Item 3 is coated by means of a #12 Meyer bar for a wet film thickness of 3 mils and dried at 220 degrees Fahrenheit (107° C.) for 2 minutes.

The Donor sheet roll is placed into the donor Supply Cartridge and positioned in the 3M Rainbow TM printer.

The above Receptor sheet is placed into the Receptor Supply Tray of said device and positioned in said device.

A four color design electronic image of a Porsche automobile is stored on to a Magneto/Optical disk available from 3M and the electronic image is transferred using a Apple Macintosh Computer IIci to the 3M Rainbow TM printer. An image of said Porsche automobile was apparent on the transparent support. It should be noted that the P56 support was more easily transported through the printer.

EXAMPLE 4

The donor sheet is identical to that described in Example 1. It was placed into the printer of Example 1 as described in Example 1.

The thermal imaging sequence and simultaneous color image formation of the Porsche automobile described in Example 1 was preformed.

The Receptor Sheet of this example consists of;
1. A 5 mil transparent polyethylene terephthalate film.
2. A 10% polymeric solution of the transfer coating disclosed in Example 1, Item 2.

Item 2 is coated by means of a #10 Meyer bar and dried at 220 degrees Fahrenheit (107° C.) for 3 minutes.

The above Receptor sheet is placed into the Receptor Supply Tray of said device and positioned in said device.

The Porsche car image stored in the Optical Disk is sent to the Apple Computer and the digital electronic signal relayed to the printer head as in Example 1. The resultant color image is transferred to the Receptor and exits the device (Transfer 1).

The Transfer 1 film is mated to another sample of the same Receptor layer and transfer from the first substrate to the second substrate (Transfer n) is effected by the laminating device of Example 1. This device has both upper and lower upper heated rollers. The temperature of the upper roller was set at 180 degrees Fahrenheit (82° C.), and the lower roller at 280 degrees Fahrenheit (138° C.), ±20 degrees at a speed of 60 ft/min.

After lamination the two sheets were separated and the four color image was seen fully adhered to the surface of the second receptor material (Transfer n) in a wrong reading form the Transfer 2 film is mated to a commercially available paper printing stock for web offset printing presses designated as 5# Brownwood paper "Text Web", the paper specified for Web Offset Printing Proofing Stock by the SWOP Inc. (Specification Web Offset Publications) Standards Group by the laminating device of Example 1(transfer n+1). The temperature of the upper roller was set at 180 degrees Fahrenheit (82° C. ), and the lower roller at 280 degrees Fahrenheit (138° C.) ±20 degrees at a speed of 60 ft/min. After this lamination the two sheets are separated and the image of the Porsche is fully adhered to the Text Web stock. There is no image on the transfer sheet. The Text Web is pliable and can be bent and folded without removing the image.

EXAMPLE 5

The procedures and equipment for Example 1 as regards donor ribbon and printer are employed in this example. The donor sheet identical, to that described in Example 1 was placed into the printer of Example 1.

The Receptor Sheet is identical to the Receptor sheet 2 in Example 1. Without imaging or passage through the printer of Example 1 the receptor sheet is placed into contact Transfer layer to Front Surface, of a sheet of opaque 5 mil Polyethylene substrate and fed through the 3M Brand Laminator of Example 1 at the same condition of Example 1.

EXAMPLE 5

When removed from the Laminator, it was noted that all the transfer layer was found on the second substrate and none on the Receptor Sheet.

The polyester substrate (containing the Transfer film from the Receptor Sheet) was then placed into the Receptor Sheet Tray of the printer and a digital image file of color patches embedded in the Printer ROM sent to the Polyester sheet. When the polyester sheet exited the printer it was found to contain a full four color image of the digital file.

EXAMPLE 6

The Donor Sheet of Example 1, the Printer of Example 1 and the electronic file of this same example were employed in this Example 6.

The Receptor Sheet of this example consists of;
1. A 5 mil transparent polyethylene terephthalate film.
2. A 10% polymeric solution of a latex emulsion (Ethylene/Poly Vinyl Acetate) available commercially as Airflex TM 4530 from Air Products.

Item 2 was coated by means of a #12 Meyer bar, coated to a wet film thickness of 3 mils (0.076 mm) and dried at 230 degrees Fahrenheit (110° C.) for 2 minutes.

The resultant receptor film was placed into the Receptor Tray of the Printer of Example 1 and imaged thermally as per Example 3.

The resultant Receptor sheet exhibited the color test pattern of the ROM file, it was then transferred to a Schoeller polyethylene receptor (available as Item No. 93-13-6) through a 3M Matchprint TM Laminator at 250 degrees Fahrenheit (124° C.). The resultant image was very glossy.

EXAMPLE 7

The Donor Sheet of Example 1, the Printer of Example 1 and the electronic file of this same example were employed in this Example 7.

The Receptor Sheet of this example consists of; the receptor sheet of Example 4 (hot melt adhesive) with an additional coated layer consisting of a 10% solution of the following composition (dye receptor solution) was coated using a #12 Meyer Bar for a wet film thickness of 3 mils and dried at 220 degrees Fahrenheit (107° C.) for 2 minutes.

A 16.8% solution consisting of;
7.34 gms MR-120 a Sulfonated Hydroxy Epoxy Functional Poly Vinyl Chloride product of Nippon Zeon.
7.34 gms VAGH/UCAR PVC/PVA Copolymer a product of Union Carbide.
2.10 gms Troysol TM CD-1 dispersant available from Troy Chemical in Methyl Ethyl Ketone.

The resultant receptor film is placed into the Receptor Tray of the Printer of Example 1 and imaged thermally as per Example 3.

The resultant Receptor sheet exhibits the Porsche image used in Example 1 with apparent higher color density.

EXAMPLE 8

The procedures and equipment for Example 1 as regards Donor Film and Printer are employed in this example. The Donor sheet, identical to that described in Example 1, is placed into the printer of Example 1. The electronic (ROM) image file (a color test pattern) from Example 5 and 6 is used for making the image in this example.

Three different Transfer Sheets are used in this example. They all use the same substrate a polyethylene laminated paper available from Schoeller Paper #93-13-6 of Pulaski N.J. The Transfer layers are identified as
  8-1 The transfer layer of Example 1.
  8-2 Coated with a 50% polymeric solution of a latex emulsion of Airflex TM 4530 from Air Products (#12 Meyer bar, 3 mil wet thickness) dried at 115° C. for 3 min.
  8-3 The transfer layers of 8-1 is top coated with a solution containing 7.34% (weight) MR-120 from Nippon Zeon, 7.34% VAGH Copolymer PVC/PVA from Union Carbide, 10% Dispersant Troysol® CD-1, Troy Chemical, and 83.22% Methyl Ethyl Ketone.

The resultant sheets were respectively imaged through the Printer of Example 1 using the electronic (ROM) image file [a color test pattern] from Example 5 and 6.

The maximum reflection Status A Color Densities (ROD) as read by a Gretag SPM 100 Spectrophotometer were recorded as follows:

| RECEPTOR LAYER | MAXIMUM DENSITY (ROD) | | | |
|---|---|---|---|---|
| | Y | M | C | K |
| 8-1 | 0.57 | 0.76 | 0.98 | NA |
| 8-2 | 0.67 | 0.93 | 0.98 | 0.98 |
| 8-3 | 1.06 | 2.04 | 2.28 | 1.73 |

It is seen that Receptor 8-3 produced the highest image density in all colors.

EXAMPLE 9

A four color 4×4 inch (1.2×1.2 mm) transferred image (Transfer n+1 Level) on the Receptor layer of Example 1 is placed onto a 4 inch diameter metal can in a transfer layer to metal can surface under pressure of a web facing the receptor sheet into intimate contact with the can. Heat of 180 degrees Fahrenheit from a hand held hot air blower manufactured by Master Heat Gun, Master Appliance Corp., 124 VAC, 60Cy, 14.5 Amps, substrate temperature of 200 degrees Fahrenheit (94° C.) was directed onto the inner surface of the can for 30 seconds. After heat removal and Receptor sheet removal the four color image is seen on the can surface (Transfer n+2). No image remains on the Receptor Sheet surface.

EXAMPLE 10

A four color 4×4 inch (10×10 cm) transferred image (Transfer n+1 Level) on the Receptor layer of Example 1 is placed onto a 2 liter glass bottle in a transfer layer to glass bottle surface, under pressure of a web facing the receptor sheet into intimate contact with the can. Heat of 190 degrees Fahrenheit from a hand held hot air blower manufactured by Master Heat Gun, Master Appliance Corp., 124 VAC, 60Cy, 14.5 Amps, substrate temperature of 200 degrees Fahrenheit (94° C.) was directed onto the inner surface of the bottle for 30 seconds. After heat removal and Receptor sheet removal the four color image is seen on the bottle surface (Transfer n+2). No image appears on the Receptor Sheet surface.

EXAMPLE 11

Preparation of PET films with microporous surface

A one-liter aqueous solution containing 1.25% by weight of Nalco 2326 colloidal silica, 0.113% of 3-aminopropyl triethoxysilane (APS), and 0.03% of TX-100 was prepared for this series of experiments. The Nalco 2326 has a mean particle size of 5 nm and is ammonium-stabilized.

A 9×12" 4-mil polyvinyldine chloride primed PET film was coated with the above solution using a #12 Meyer bar and dried in an oven at 110° C. for 2 minutes. The resulting film has a microporous surface but was very transparent. It was subsequently used as a retransfer receiver.

EXAMPLE 12

Preparation of thermal dye transfer receptors

Two thermal dye transfer receptors were prepared by slot-coating an A solution, 10% of (48.08% MR-120/48.08% Ucar VYNS/3.85% amino silicone KF-393) in MEK, and a B solution containing 10% of (42.74% MR-120/42.74% VYNS/5.98% Troysol CD1/8.55% CB601) in MEK, respectively, onto 3.88 mil 27" 3M polyethylene terephthalate film (precoated with SYMTHEMUL TM 97-603 latex, a self-crosslinking acrylic latex emulsion manufactured by REICH-HOLD Chemicals) and dried at 150 to 200 degrees Fahrenheit to a dry coating weight of 6 g/m².

A 3M Rainbow TM printer as described above was used to make a full color image using a 4-color ribbon (MK-2) on the resulting receptors. The images were clean and free of any mass transfer problem.

EXAMPLE 13

Image retransfer

A 3M Model 1147 Laminator was used to make image layer retransfer. The above imaged dye receptors with image side down were placed on the retransfer receiver prepared in Example 12 and passed through the laminator at 290 degrees Fahrenheit at 0.8"/sec. After being cooled to room temperature, the PET backing of the original dye receptors was peeled off, leaving two clean and glossy prints on the receiver. No image splitting or bubbles were observed.

EXAMPLE 14

Preparation of retransferrable receptor

On 3.88 mil 27" 3M polyethylene terephalate PET film precoated with SYMTHEMUL TM latex was coated with the solution prepared in Example 11 using #12 Meyer bar and dried at 110° C. for 2 minutes, resulting a crosslinked microporous surface firmly adhered to the film. The receptor was later used in Example 18 for multiple image layer retransfer.

Example 15

Preparation and comparison of dye receptivity of receptors with and without a solid solvent Receptor A with meltable 2-hydroxy-4-n-octyloxybenzophenone —3M 4 mil polyester film precoated with SYMTHEMUL TM 97-603 latex was coated with a solution containing 20 wt% of 15 wt% MR-120 and 80 wt % of 15 wt% VYNS-3 in MEK and the meltable additive, 20 wt% of the combined resin, using #12 Meyer bar to a dry thickness of about 6 micrometers. It was dried at 100° C. for one minute and then dried at 54.5° C. for 2 hours to increase concentration of the additive at the receptor surface.

Receptor B without additive—This receptor was prepared by the same method as Receptor A but without the additive. Dye Receptivity—Dye receptivity for Receptors A & B was tested by transferring a Mitsubishi yellow, cyan, magenta and black donors (MK-2) through 3M Rainbow ( TM ) Printer using it's self print color pattern.

The resulting image density (reflectance optical density, ROD) on each of the above receptors and other receptors containing other solid solvents was measured with a Gretag SPM-100 densitometer. The results are summarized in Table 1.

TABLE 1

Receptivity of Various Receptors

| Receptor | Image Density, ROD | | | |
|---|---|---|---|---|
| | Yellow | Magenta | Cyan | Black |
| A. w/AM300[1] | 0.79 | 1.16 | 1.25 | 1.07 |
| B. (control) | 0.68 | 1.02 | 1.08 | 0.94 |
| C. w/N-35[2] | 0.74 | 1.15 | 1.24 | 1.03 |
| D. w/M-40[3] | 0.75 | 1.16 | 1.23 | 1.02 |
| E. w/Diphenyl amine | 0.74 | 1.08 | 1.16 | 0.98 |
| F. w/DPE[4] | 0.73 | 1.14 | 1.21 | 0.99 |
| G. w/TPM[5] | 0.76 | 1.21 | 1.27 | 1.05 |
| H. w/DPP[6] | 0.76 | 1.18 | 1.27 | 1.05 |
| I. w/TPP[7] | 0.76 | 1.26 | 1.31 | 1.05 |

Notes:
1 = 2-hydroxy-4-n-octyloxy-benxophenone (m.p. = 47° C.)
2 = Cinnamyl alcohol (m.p. = 35° C.)
3 = 2-hydroxy-4-methoxy-benzophenone (m.p. = 62° C.)
4 = 1,1-diphenylethanol (m.p. = 79° C.)
5 = Triphenylmethane (m.p. = 93° C.)
6 = 2,2-diphenyl-1,3-propanediol (m.p. = 107° C.)
7 = Triphenylphosphate (m.p. = 23° C.).

EXAMPLE 16

Compatibility of Solid Solvents with Dyes

A Haake Buchler (England) melting point apparatus was used to determine the melting point of individual solid solvents and dyes as well as their mixture. 1.5–1.8×90 mm capillary glass tubes were used to hold powder samples. Two thermal transferable dyes were used. One is HSR-31 (Mitsubishi Kasei Corp., Tokyo, Japan) magenta dye, m.p.=121° C. and the other is Foron Brilliant Blue (Sandoz Chemicals, Charlotte, NC) cyan dye, m.p.=140° C.

The dyes were mixed respectively with various solid solvents in 1-to-5 weight ratio and placed in the capillary tubes for melting point measurement. The results are shown in Table 2.

TABLE 2

Melting Points for Dyes and Solid Solvents

| Solid Solvent | Melting Point, °C. Alone | with Dye | −ΔT | Soluble? Compatible? |
|---|---|---|---|---|
| A. When HSR-31 dye is used: | | | | |
| Diphenylamine | 53 | 49 | 4 | Yes |
| 2-hydroxy-4-n-octyloxy-benxophenone | 47 | 47 | 0 | Yes |
| 1,1-diphenyl-ethanol | 79 | 74 | 5 | Yes |
| 2,2-diphenyl-1,3-propanediol | 107 | 102 | 5 | Yes |
| Triphenylmethane | 93 | 87 | 5 | Yes |
| B. When Foron Brilliant Blue dye is used: | | | | |
| Diphenylamine | 53 | 49 | 4 | Yes |
| 2-hydroxy-4-n-octyloxy-benxophenone | 47 | 47 | 0 | Yes |
| 1,1-diphenyl-ethanol | 79 | 74 | 5 | Yes |
| 2,2-diphenyl-1,3-propanediol | 107 | 102 | 5 | Yes |
| Triphenylmethane | 93 | 88 | 4 | Yes |

It is seen from the above table that the solid solvents are compatible with the dyes. They all formed clear color solution when melted, indicating good compatibility and solubility of the dye in the solvents. Also the melting point depression for most of the mixtures is high (over 5° C.), indicating the possibility of eutectic formation.

Example 17

Screening Test for finding useful Solid Solvents for Dye Reception

A melting point apparatus similar to the above-mentioned Haake Buchler melting point apparatus but with larger sample holes was used to screen the presence of the solid solvents described in the invention.

The receptor B (without a solid solvent) and the receptor A (containing 2-hydroxy-4-n-octyloxy-benzophenone in the dye receiving layer) prepared in Example 15 were tested in the apparatus. They were trimmed to ¼×2" sheet and the dye receiving layer was covered with the HSR-31 dye powder. Each of the samples were then inserted into a 1/16×⅜×4" microslide and placed in the apparatus with dye receiving layer facing the observing window.

The dye on the receptors was seen to change from dark particles to faint magenta then to bright magenta as the temperature was increased from room temperature to 110° C. The changes on the receptor A (with solid solvent) took place at lower temperature than those on the receptor B (without a solid solvent). The results are summarized in Table 3.

TABLE 3

Receptor A vs. B (without dye solvent) on Dye Reception

| Bath Temp °C. | Interaction between Dye & Receptor Receptor B | Receptor A |
|---|---|---|
| 25 | Dark dye powder | Dark dye powder |
| 67 | " | Faint magenta |
| 76 | Faint magenta | More magenta |
| 110 | Dull magenta (ROD = 1.2) | Bright magenta, ROD = 2.4 |

It is seen that the receptor A with solid solvent is more responsive than receptor B to temperature, indicating the presence of a dye solvent in the receptor.

The above procedure was repeated except that Foron Brilliant Blue dye and receptor E (with diphenylamine, see Example 15) were used instead. The results are shown in Table 4.

TABLE 4

Receptor A vs. B (without dye enhancer) on Dye Reception

| Bath Temp °C. | Interaction between Dye & Receptor Receptor B | Receptor E |
|---|---|---|
| 25 | Dark dye powder | Dark dye powder |
| 78 | " | Faint cyan |
| 100 | Faint cyan | More cyan |
| 110 | Dull cyan (ROD = 0.5) | Bright cyan, ROD = 1.1 |

It is also seen from Table 4 that the receptor E with solid solvent is more responsive than receptor B to temperature, indicating the presence of a dye solvent in the receptor.

EXAMPLE 18

Multiple image retransfer

Receptor A prepared in Example 14 was imaged through the thermal printer to produce a full color 5×7" print of "Vegetables" using the same four color ribbon. It was then laminated with the retransferrable receptor from Example 14 using the same laminator under the same condition (transfer n). After peeling off the PET backing, a reversed, glossy picture was left on the receiver. This concluded the first retransfer process.

A Matchprint TM publication base paper was then used to receive the transferred image. The image on the retransferrable receptor was then laminated to the paper in the same manner as the first image layer retransfer. After peeling off the PET substrate from the retransferrable receptor (n+1), a clean, glossy, and positive image was formed on the paper. This process was repeated (n+2) using a Matchprint TM laminator with top roller temperature of 280 degrees Fahrenheit (138° C). The same successful result was obtained.

Example 19

A transfer sheet (n+2 level) containing an image of vegetables, produced by the final action of Example 18 was mated to a transparent polyester transfer sheen (n) containing an image of a Porsche (TM) automobile, produced by the action of Example 5. This sandwich was laminated by the 3M Matchprint Laminator with the lamination conditions of Example 5. After removing the polyester support the image of an automobile is seen superimposed on that of the vegetables. No evidence of an image is apparent on the polyester support. This composite image (auto+vegetables) is further mated to a final sheet consisting of 3M Matchprint Commercial base and is laminated to it by the means just described. When the support of the composite image is removed, the composite image is seen on the Matchprint support.

EXAMPLE 20

Opaqueing agent in the hot melt adhesive layer

The transfer n receptor ("B" sheet) of this example consists of a hot melt adhesive layer made by combining the following:

Titanium Dioxide (65% by weight in water) 1,444 grams

Reichold Latex Adhesive #97603 (45% by weight in water) 1.11 grams

Deionized water—sufficient to adjust the solution to 35% by weight of solids.

The resultant solution was coated onto an A3 size transparent support using a #10 Meier bar and dried at 220° F. for 2 minutes to provide a transfer n ("B" sheet) with a dry solids coating weight of 300 milligrams per square foot. Three separate polyester sheets are coated with this solution.

An A3 size receptor sheet described in Example 1, "Y" is imaged by the same means of that example to provide a 4 color red automobile image on said receptor (transfer 1). The final image is characterized by the fact that although the image appears on a clear transparent support (transfer 1). This receptor sheet now imaged is mated coated side to coated side to one of the transfer sheets ("B" sheet) of the construction in this example and laminated together using the 3M Model 1147 Matchprint (TM) laminator at the speed and temperature of 290° F. at 0.8 inches per second. After being cooled to room temperature the sheets are separated (transfer n), only a panel of opaque white is visible from the coated side of the transfer sheet. If the transfer sheet is viewed through the transparent support, a full color image on a white opaque support is evident.

This action is repeated using a transfer ("B" sheet) sheet without an opaqueing agent in the hot melt adhesive layer (example 1, "Y" sheet). After n+1 transfer a bluish red automobile image is seen on a muddy bluish background with a surround of blue paper.

The opaque layer provides image acceptability and continued good color rendition.

Example 21

Barrier Layer

The solutions of Example 3, a hot melt adhesive layer and a dye receptor layer are coated onto a transparent base under the same coating conditions. However in one construction a barrier layer of polyvinylalcohol is coated between the adhesive and dye receptor layers; in the other construction no barrier layer is employed. Composition of barrier layer:

Water, deionized 95 grams
Polyvinylalcohol (Monsanto 20/90) 5 grams
Sodium Tetraborate 0.01 grams This solution is coated on the hot melt adhesive using a #8 Meier Bar to an equivalent dry coating weight of 90 milligrams per square foot.

Transfer Support #1 consists of the two coated solutions (both are soluble in methylethylketone) as described in Example 2 coated on top of each other (no barrier layer). Transfer Support #2 consists of the layers of Example 2 with the layer of PVA between each of the layers.

The following table details the conditions necessary to exemplify the solvent protection provided by a barrier layer.

TABLE 1

| PROCEDURE FOR PREPARATION OF SUPPORTS #1 AND #2 | | |
|---|---|---|
| TASK | #1 | #2 |
| HOT MELT LAYER | | |
| COATING | 10 SEC. | 10 SEC. |
| DRYING | 120 SEC. | 120 SEC. |
| BARRIER LAYER | | |
| COATING | NOT APPLICABLE | 10 SEC. |
| DRYING | NOT APPLICABLE | 120 SEC. |
| DYE RECEIVING LAYER | | |
| COATING | 10 SEC. | 10 SEC. |
| DRYING | 120 SEC. | 120 SEC. |

RESULTS

The solvents in the dye receptor layer redissolve the hot melt adhesive layer in support #1. Support #2 shows no sign of being redissolved and is able to be utilized as a image receptor. The barrier layer enables an improvement in quality and enables an increase in manufacturing process capability.

What is claimed

1. A non light-sensitive thermal transfer sheet comprising in order:
    a) a flexible substrate,
    b) a hot melt adhesive layer comprising a thermally softenable polymeric binder having from 0.01 to 0.25 percent by weight of particles therein having a number average diameter of 3 to 30 micrometers which do not dissolve in the softenable polymeric binder, and
    c) a polymeric dye receptor layer comprising a different polymer than the polymeric binder of layer b), the particles of layer b) not protruding beyond the surface of layer c) without being covered by the material of layer c), wherein said different polymer of layer c) has a higher glass transition temperature than the polymeric binder of layer b), and
wherein a dye reception enhancement layer (d) comprising a binder and a solid solvent for dye is present between b) and c) and a barrier layer is present between said thermal adhesive layer and said dye reception enhancement layer.

2. A non light-sensitive thermal transfer sheet comprising in order:
    a) a flexible substrate,
    b) a hot melt adhesive layer comprising a thermally softenable polymeric binder having from 0.01 to 0.25 percent by weight of particles therein having a number average diameter of 3 to 30 micrometers which do not dissolve in the softenable polymeric binder, and
    c) a polymeric dye receptor layer comprising a different polymer than the polymeric binder of layer b), the particles of layer b) not protruding beyond the surface of layer c) without being covered by the material of layer c), wherein said different polymer of layer c) has a higher glass transition temperature than the polymeric binder of layer b), and a dye reception enhancement layer (d) comprising a binder and a solid solvent for dye is present between b) and c) and a barrier layer is present between said thermal adhesive layer and said dye reception enhancement layer.

3. A non light-sensitive thermal transfer sheet comprising in order:
    a) a flexible substrate,
    b) a hot melt adhesive layer comprising a thermally softenable polymeric binder having from 0.01 to 0.25 percent by weight of particles therein having a number average diameter of 3 to 30 micrometers which do not dissolve in the softenable polymeric binder, and c) a polymeric dye receptor layer comprising a different polymer than )he polymeric binder of layer b), the particles of layer b) not protruding beyond the surface of layer c) without being covered by the material of layer c), wherein said different polymer of layer c) has a higher glass transition temperature than the polymeric binder of layer b), wherein wherein said different binder has a glass transition temperature of from 50° to 150° C., and a dye reception enhancement layer (d) comprising a binder and a solid solvent for dye is present between b) and c) and a barrier layer is present between said thermal adhesive layer and said dye reception enhancement layer.

4. A non light-sensitive thermal transfer Sheet comprising in order:
 a) a flexible substrate,
 b) a hot melt adhesive layer comprising a thermally softenable polymeric bidder having from 0.01 to 0.25 percent by weight of particles therein having a number average diameter of 3 to 30 micrometers which do not dissolve in the softenable polymeric binder, and
 c) a polymeric dye receptor layer comprising a different polymer than the polymeric binder of layer b), the particles of layer b) not protruding beyond the surface of layer c) without being covered by the material of layer c), wherein said different polymer of layer c) has a higher glass transition temperature than the polymeric binder of layer b), and said different polymer comprises a polymer selected from the group consisting of polyesters, polyurethanes polyacrylates, polyamides, poly(vinyl chloride), poly(vinyl acetate), sulfonated polyesters, sulfonated polyethanes, and coplymers thereof, and a dye reception enhancement layer (d) comprising a binder and a solid solvent for dye is present between b) and c) and a barrier layer is present between said thermal adhesive layer and said dye reception enhancement layer.

5. A non light-sensitive thermal transfer sheet comprising in order:
 a) a flexible substrate,
 b) a hot melt adhesive layer comprising a thermally softenable polymeric binder having from 0.01 to 0.25 percent by weight of particles therein having a number average diameter of 3 to 30 micrometers which do not dissolve in the softenable polymeric binder, and
 c) a polymeric dye receptor layer comprising a different polymer than the polymeric binder of layer the particles of layer b) not protruding beyond the surface of layer c) without being covered by the material of layer c), wherein said different polymer comprises a polymer selected from the group consisting of polyesters, polyurethanes, polyacrylates, polyamides, poly(vinyl chloride), poly(vinyl acetate), sulfonated polyesters, sulfonated polyurethanes, and coplymers thereof, and a dye reception enhancement layer (d) comprising a binder and a solid solvent for dye is present between b) and c) and a barrier layer is present between said thermal adhesive layer and said dye reception enhancement layer.

6. A non light-sensitive thermal transfer sheet comprising in order:
 a) a flexible substrate,
 b) a hot melt adhesive layer comprising a thermally softenable polymeric binder having from 0.01 to 0.25 percent by weight of particles therein having a number average diameter of 3 to 30 micrometers which do not dissolve in the softenable polymeric binder, and
 c) a polymeric dye receptor layer comprising a different polymer than the polymeric binder of layer b), the particles of layer b) not protruding beyond the surface of layer c) without being covered by the material of layer c), wherein a dye reception enhancement layer (d) comprising a binder and a solid solvent for dye is present between b) and c).

7. A non light-sensitive thermal transfer sheet comprising in order:
 a) a flexible substrate,
 b) a hot melt adhesive layer comprising a thermally softenable polymeric binder having from 0.01 to 0.25 percent weight of particles therein having a number average diameter of 3 to 30 micrometers which do not dissolve in the softenable polymeric binder, and
 c) a polymeric dye receptor layer comprising a different polymer than the polymeric binder of layer b), the particles of layer b) not protruding beyond the surface of layer c) without being covered by the material of layer c), wherein said different polymer of layer c) has a higher glass transition temperature than the polymeric binder of layer b) a dye reception enhancement layer (d) comprising a binder and a solid solvent for dye is present between b) and c).

8. A non light-sensitive thermal transfer sheet comprising in order:
 a) a flexible substrate,
 b) a hot melt adhesive layer comprising a thermally softenable polymeric binder having from 0.01 to 0.25 percent by weight of particles therein having a number average diameter of 3 to 30 micrometers which do not dissolve in the softenable polymeric binder, and
 c) a polymeric dye receptor layer comprising a different polymer than the polymeric binder of layer b), the particles of layer b) not protruding beyond the surface of layer c)without being covered by the material of layer c), wherein said different polymer of layer c) has a higher glass transition temperature than the polymeric binder of layer b), said different polymeric binder has a glass transition temperature of from 50° to 150° C., and a dye reception enhancement layer (d) comprising a binder and a solid solvent for dye is present between b) and c).

9. A non light-sensitive thermal transfer sheet comprising in order:
 a) a flexible substrate,
 b) a hot melt adhesive layer comprising a thermally softenable polymeric binder having from 0.01 to 0.25 percent by weight of particles therein having a number average diameter of 3 to 30 micrometers which do not dissolve in the softenable polymeric binder, and
 c) a polymeric dye receptor layer comprising a different polymer than the polymeric binder of layer b), the particles of layer b) not protruding beyond the surface of layer c) without being covered by the material of layer c), said different polymer of layer c) has a higher glass transition temperature than the polymeric binder of layer b), and comprises a polymer selected from the group consisting of polyesters, polyurethanes, polyacrylates, polyamides, poly(vinyl chloride), poly(vinyl acetate), sulfonated polyesters, sulfonated polyurethanes, and coplymers thereof, and dye reception enhancement layer (d) comprising a binder and a solid solvent for dye is present between b) and c).

10. A non light-sensitive thermal transfer sheet comprising in order:
   a) a flexible substrate,
   b) a hot melt adhesive layer comprising a thermally softenable polymeric binder having from 0.01 to 0.25 percent by weight of particles therein having a number average diameter of 3 to 30 micrometers which do not dissolve in the softenable polymeric binder, and
   c) a polymeric dye receptor layer comprising a different polymer than the polymeric binder of layer b), the particles of layer b) not protruding beyond the surface of layer c) without being covered by the material of layer c), said different polymer comprises a polymer selected from the group consisting of polyesters, polyurethanes, polyacrylates, polyamides, poly(vinyl chloride), poly(vinyl acetate), sulfonated polyesters, sulfonated polyurethanes, and coplymers thereof, and wherein a dye reception enhancement layer (d) comprising a binder and a solid solvent for dye is present between b) and c).

* * * * *

UNITED STATES PATENT AND TRADEMARK OFFICE
CERTIFICATE OF CORRECTION

PATENT NO. : 5,372,987  Page 1 of 2
DATED : December 13, 1994
INVENTOR(S) : Fisch et al.

It is certified that error appears in the above-indentified patent and that said Letters Patent is hereby corrected as shown below:

Column 8, line 52, delete "0,005%" and insert --0.005%--.
Column 9, line 61, delete "4,6705,521" and insert --4,670,521--.
Column 10, lines 43-44, delete "such those" and insert --such as those--.
Column 10, line 52, delete "addition" and insert --additional--.
Column 19, line 15, delete "condition" and insert --conditions--.
Column 22, line 46, delete "benxophenone" and insert --benzophenone--.
Column 23, lines 10 and 18, delete "benxophenone" and insert --benzophenone--.
Column 25, line 1, delete "1,444" and insert --1.444--.

UNITED STATES PATENT AND TRADEMARK OFFICE
CERTIFICATE OF CORRECTION

PATENT NO. : 5,372,987

DATED : December 13, 1994

INVENTOR(S) : Fisch et al.

It is certified that error appears in the above-indentified patent and that said Letters Patent is hereby corrected as shown below:

Column 27, line 6, delete ")he" and insert --the--.

Column 27, line 39, delete "polyethanes" and insert --polyurethanes--.

Column 27, line 55, delete "layer the" and insert --layer b), the--.

Signed and Sealed this

Twenty-fifth Day of April, 1995

BRUCE LEHMAN

*Attest:*

*Attesting Officer*     *Commissioner of Patents and Trademarks*